United States Patent
Klein

(10) Patent No.: US 6,806,152 B1
(45) Date of Patent: Oct. 19, 2004

(54) RETROGRADE DOPED BURIED LAYER TRANSISTOR AND METHOD FOR PRODUCING THE SAME

(75) Inventor: Wolfgang Klein, Zorneding (DE)

(73) Assignee: Infineon Technologies AG, München (DE)

(*) Notice: Subject to any disclaimer, the term of this patent is extended or adjusted under 35 U.S.C. 154(b) by 0 days.

(21) Appl. No.: 10/130,083
(22) PCT Filed: Nov. 21, 2000
(86) PCT No.: PCT/EP00/11591
§ 371 (c)(1), (2), (4) Date: May 10, 2002
(87) PCT Pub. No.: WO01/39274
PCT Pub. Date: May 31, 2001

(30) Foreign Application Priority Data

Nov. 26, 1999 (DE) .......................... 199 57 113

(51) Int. Cl.[7] ...................... H01L 21/331; H01L 21/336
(52) U.S. Cl. ...................... 438/301; 438/306; 438/309
(58) Field of Search ................... 438/301, 306, 438/309, 307

(56) References Cited

U.S. PATENT DOCUMENTS

| 4,319,932 A | 3/1982 | Jambotkar |
| 5,320,972 A | 6/1994 | Wylie |
| 5,326,710 A | 7/1994 | Joyce et al. |
| 5,569,611 A | 10/1996 | Imai |
| 5,656,514 A | 8/1997 | Ahlgren et al. |
| 5,773,349 A | 6/1998 | Ham |
| 5,807,780 A * | 9/1998 | Davis et al. ................. 438/331 |
| 6,265,275 B1 | 7/2001 | Marty et al. |

FOREIGN PATENT DOCUMENTS

| DE | 196 11 692 | 10/1997 |
| EP | 0 762 511 | 3/1997 |
| EP | 0 949 665 | 10/1999 |
| EP | 0 962 967 | 12/1999 |
| WO | WO 97/17726 | 5/1997 |

OTHER PUBLICATIONS

M. Sugiyama et al, "A 40GHz ft Si Bipolar Transistor LSI Technology", 1989 International Electron Devices Meeting, 89 IEDM, Technical Digest, pp. 221–224.

* cited by examiner

Primary Examiner—Alexander Ghyka
(74) Attorney, Agent, or Firm—Schiff Hardin LLP

(57) ABSTRACT

An active transistor area with a retrograde doping area on a substrate in bipolar technology is produced by a method including the following steps: providing a substrate; producing a buried doping area in the substrate; producing an epitaxy layer; producing a retrograde doping profile in said epitaxy layer, so that the highly doped area of the buried doping area is enlarged in the direction of the substrate surface.

7 Claims, 3 Drawing Sheets

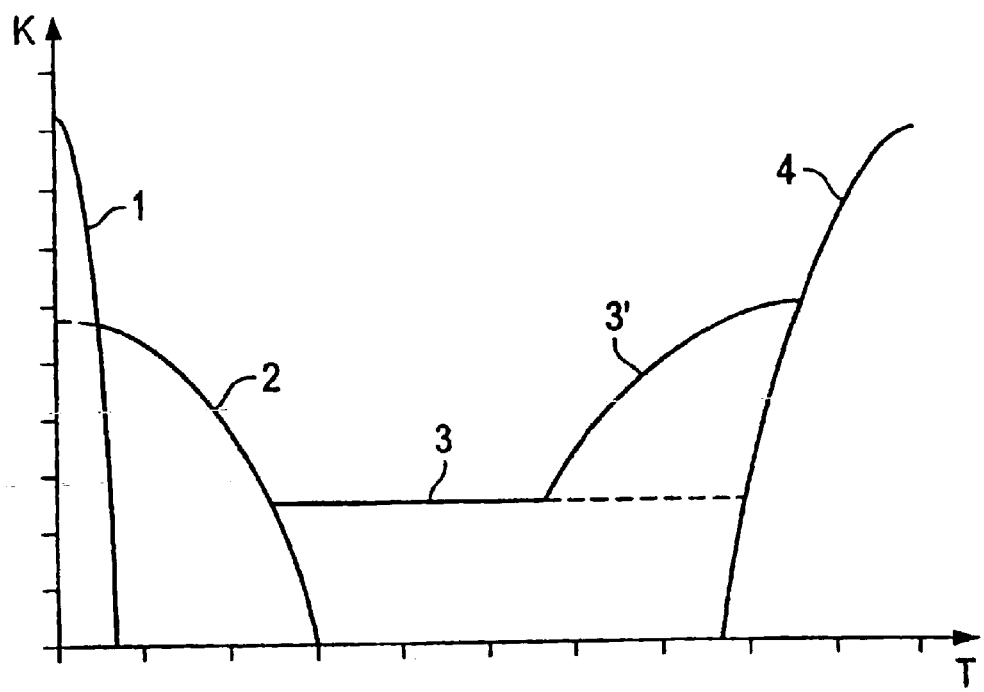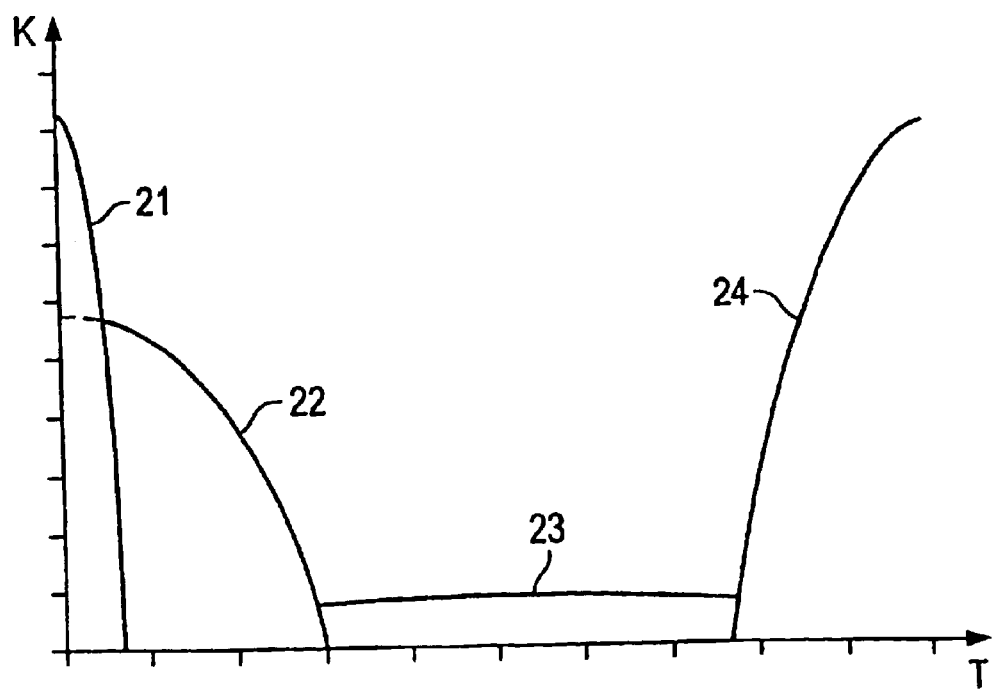

RETROGRADE DOPED BURIED LAYER TRANSISTOR AND METHOD FOR PRODUCING THE SAME

BACKGROUND OF THE INVENTION

The invention relates to a method for fabricating an active transistor region in a bipolar technology on a substrate, and to an active transistor region which is fabricated by this method.

Integrated circuits having transistors with a high cut-off frequency are required for typical radiofrequency applications, such as wireless communications technology. The fabrication of integrated bipolar transistors with a high cut-off frequency of about $f_{cut-off}$=50 GHz is technically complex. Integrated transistors, which are fabricated using bipolar technology, usually have a buried collector, which is fabricated by a process sequence, which first implants a dopant with low energy in a semiconductor substrate surface. A monocrystalline silicon layer having a specific thickness is subsequently deposited epitaxially, thereby producing a buried doping region. Afterward, further or additional steps are carried out for completing the transistors, such as, for instance, the application of additional layers for fabricating a base region and an emitter region.

DE 196 11 692 A1 describes a corresponding process for fabricating bipolar transistors in a CMOS-compatible silicon-germanium technology with the transistors having a dielectric strength of about $V_{CEO}$=4 V. The transistors described in DE 196 11 692 can be used for applications up to a frequency of about 25 GHz.

The dielectric strength of the described transistors and the switching speed are essentially determined by the thickness of the epitaxial layer, which has a value of 0.8 $\mu$m in the case of transistors in accordance with DE 196 11 692 A1. If the thickness of the epitaxial layer were increased, it would be possible to fabricate transistors with increased dielectric strength. This is not practicable, however, since the cut-off frequency of the transistor would be reduced by an increased thickness of the epitaxial layer.

SUMMARY OF THE INVENTION

It is an object of the present invention to further develop the above-described known fabrication method in such a way that it is possible to fabricate simultaneously transistors with a high dielectric strength and transistors with an increased cut-off frequency compared with the known method.

This object is achieved according to the invention by a method comprising the steps of providing a substrate, producing a buried doping region in the substrate, producing an epitaxial layer, which is doped more lightly than the buried doping region on the substrate, producing a retrograde doping profile in the epitaxial layer by either a single-stage or multi-stage high-energy implantation of suitable dopants so that the highly doped region of the buried doping region is enlarged in the direction of the substrate surface, and carrying out additional known method steps for completing the active transistor region.

The method according to the invention is particularly flexible since different types of semiconductor components can be fabricated in parallel on the same substrate. In the sense of the invention, the term "different types" means that it is possible to fabricate transistors which are optimized either with regard to the dielectric or voltage strength or with regard to the radiofrequency or high-frequency properties.

It is advantageous, moreover, that the process is not made unnecessarily complicated by the process steps that are additionally required according to the invention.

It is likewise advantageous that the process is fully CMOS-compatible but also BiCMOS-compatible.

According to the invention, a single-stage or multi-stage high-energy implantation is carried out which enables a retrograde doping profile to be fabricated in the epitaxial layer in a region of the substrate. The high-energy implantation is preferably effected in two stages. Preferably, the region of the retrograde doping directly adjoins the highly doped region of the buried doping region so that the size of the highly doped doping region is enlarged. The consequence of this is that it is possible to locally produce a transistor comparable to a transistor which is fabricated by means of a process in which the epitaxial layer has been fabricated comparatively thinner.

After the high-energy implantation, the method according to the invention is continued in a manner known per se for completing the desired transistors. If the intention is to fabricate an npn transistor in the relevant substrate region, then there follow process steps for fabricating a base zone and an emitter zone. On the other hand, if the intention is to fabricate a pnp transistor, there follow, in a manner known per se, modified steps for producing a complementary transistor. Reference is made to DE 196 11 692 A1 for example.

In a preferred embodiment, an oxide layer, for example a TEOS (tetraethylorthosilicate)layer having a thickness of preferably less than 400 nm, and preferably having a thickness in the range from 20 to 200 nm, is produced above the epitaxial layer. The application of the TEOS layer is generally followed by a densification of the TEOS layer by a thermal treatment. This layer is preferably fabricated before the high-energy doping. This is advantageous since the oxide layer acts as a screen oxide with regard to the implanted dopants.

In one development of the method, a p-doped polysilicon layer, for example, is produced before the high-energy doping above the oxide layer. This is followed by an etching step for producing an opening in the polysilicon layer above the active transistor region. The etching stops on the oxide layer lying below the polysilicon layer. Preferably, an arrangement for laterally limiting the propagation of the implanted dopants is produced, and, for example, a photoresist mask is provided above the p-type polysilicon layer. The opening in the laterally limiting arrangement is preferably chosen to be larger than the etched-in opening in the p-type polysilicon layer.

The invention also relates to a method for fabricating an arrangement which is integrated on a substrate and comprises transistors of a first type with a high breakdown voltage and transistors of a second type with a high cut-off frequency by using the method to fabricate the transistors of the second type in contrast to the transistors of the first type.

According to the invention, the method according to the invention is carried out in the region of the transistor of the second type. No high-energy implantation for enlarging the buried collector region is carried out in the region of the transistor of the first type. In this way, a comparatively thick epitaxial layer can be applied during the process on the entire substrate, resulting in a high dielectric strength in the case of the transistors of the first type.

The transistor regions thus essentially differ by the fact that in the region between the buried doping region and the base region different doping profiles are produced, or in the specific case a retrograde doping profile in the second type and no doping profile in the first type.

A doping profile according to the invention is to be understood as the profile of the doping concentration in the direction perpendicular to the main surface of the substrate through the active region of the transistor.

In the substrate region of the transistor of the first type, a planar doping profile is preferably produced by in-situ doping during the fabrication of the epitaxial layer. Preferably, a dopant is produced by means of beam implantation during the growth process. Preferably, the transistor of the first type has, in the region of the epitaxial layer, an essentially "planar" doping profile in which the concentration of the dopant/dopants is essentially constant and lower than the dopant concentration in the highly doped region.

The method according to the invention can be used to fabricate an active transistor region in a semiconductor structure fabricated in bipolar technology and having a substrate, a buried doping region and an epitaxial layer, which is doped more lightly than the buried doping region, and a retrograde doping region with a doping concentration which rises from the surface of the substrate in the direction of the buried doping region is present in the epitaxial layer. Therefore, the present invention also relates to an active transistor region.

The thickness of the epitaxial layer is preferably at least 300 nm, and particularly at 500 nm.

According to the invention, it is possible to fabricate transistor regions for pnp transistors and npn transistors. If a pnp transistor region is fabricated, it is preferred to provide the region of the retrograde doping with an n-type doping using phosphorus, for example, as the dopant. In a region with a transistor region for an npn transistor, the region of the retrograde doping is preferably p-doped.

The transistor which can be fabricated according to the invention preferably has a silicon-germanium base. Such a base can be fabricated by means of the method of the selective epitaxial growth of a silicon-germanium layer.

Transistors which are optimized with regard to the radiofrequency properties and have a cut-off frequency $f_{cut-off}$ in the range from 70 to 100 GHz can be fabricated according to the invention. The dielectric strength $U_{CEO}$ of the transistor which is optimized with regard to the radiofrequency properties is preferably at least 2 V. The dielectric strength of the transistor which is optimized with regard to the breakdown voltage has $U_{CEO}$ preferably in the range of 3 to 7 V, in particular in the range of 5 to 6 V.

BRIEF DESCRIPTION OF THE DRAWINGS

FIG. 2 shows a diagrammatic doping profile of a transistor according to the invention with properties which are optimized with regard to the radiofrequency properties;

FIG. 3 shows a diagrammatic doping profile of a transistor with optimized properties with regard to the breakdown voltage.

DESCRIPTION OF THE PREFERRED EMBODIMENTS

Figure 1:
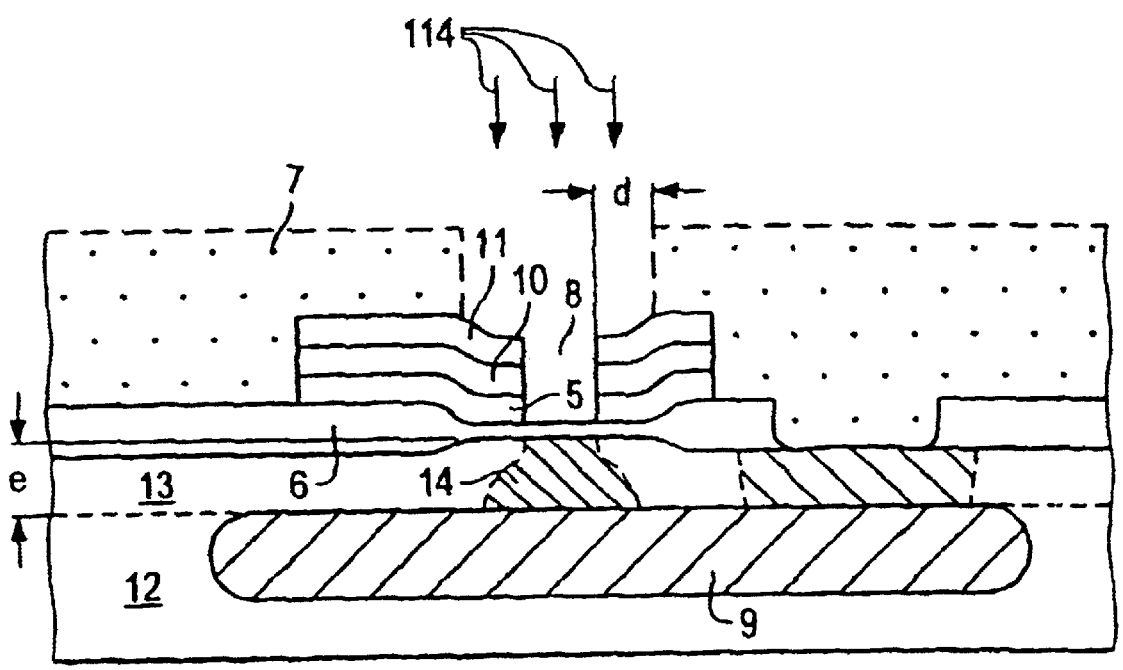
FIG. 1 shows a diagrammatic illustration of a cross section through an active region of a transistor in a semiconductor structure which is optimized with regard to the radiofrequency properties.

In FIG. 1 a npn radiofrequency transistor is shown and has an epitaxial layer 13 made of silicon having the thickness e=600 nm. The layer 13 is produced on a p-doped silicon substrate 12 with a buried doping region or buried layer 9. The epitaxial layer is doped in situ by arsenic implantation with a dose of $1 \cdot 10^{16}$ cm$^{-3}$.

Above the epitaxial layer 13, an oxide layer 6 having the thickness 100 nm is then applied and after that a p-type polysilicon layer 5 is applied on the layer 6. An overlying TEOS layer 10 and a nitride layer 11 arranged above the TEOS layer 10 are then fabricated. After these layers have been fabricated, an opening in the emitter region 8 having a diameter 500 nm is produced in the layers 11, 10 and 5 by means of an etching step. The etching stops at the oxide layer 6. Finally, a resist layer 7 is applied to the nitride layer 11, and has an opening which has a larger radius than the opening in the emitter region 8 by the magnitude d=350 nm.

This is followed by the high-energy implantation of phosphorus ions in the direction of the arrows 114 for producing a retrograde doping region 14 in the epitaxial layer 13.

The high-energy ion implantation is effected in two stages. In a first stage, phosphorus (P+) is implanted with E=110 keV and a dose of $1.5 \cdot 10^{12}$ cm$^2$ with a temperature of 0° C. In a second stage, phosphorus (P+) is implanted with E=350 keV and a dose of $4.05 \cdot 10^{-12}$ cm$^{-2}$ with a temperature of 0° C. The base and the emitter are not yet present at this point in time. The doping region produced by the high-energy implantation can also be referred to as "pseudo buried layer".

FIG. 2 shows, in a diagrammatic representation, the diagram of the doping concentration K as a function of the depth T, where K rises proceeding from the substrate surface in the direction of the buried doping region, for a transistor region in accordance with FIG. 1 (RF transistor). The curve for the emitter doping 1, the dopant being arsenic in the example, falls sharply as the depth T increases. Curve 2 represents the doping profile for the boron-doped base. The base curve 2 falls less sharply than the emitter curve 1 and ends in the region of the epitaxial region near the surface. The collector profile 3 begins flat, as seen from the substrate surface, and changes discontinuously into a rising profile with a decreasing gradient, which is referred to as a retrograde doping profile 3'.

FIG. 3, in a manner corresponding to FIG. 2, diagrammatically shows the doping concentration for a transistor region which is optimized with regard to the breakdown voltage (RF transistor). The emitter curve 21, the base curve 22 and the curve of the buried doping region 24 have profiles as represented in FIG. 2. The profile of the doping concentration 23 in the collector is flat, however, and is produced in the case of a uniform in-situ doping during the fabrication of the epitaxial layer. As is shown by the curve for the doping concentration 23, the doping concentration in the collector is at a lower level compared with the RF transistor (curve 3 in FIG. 2).

Figure 4:
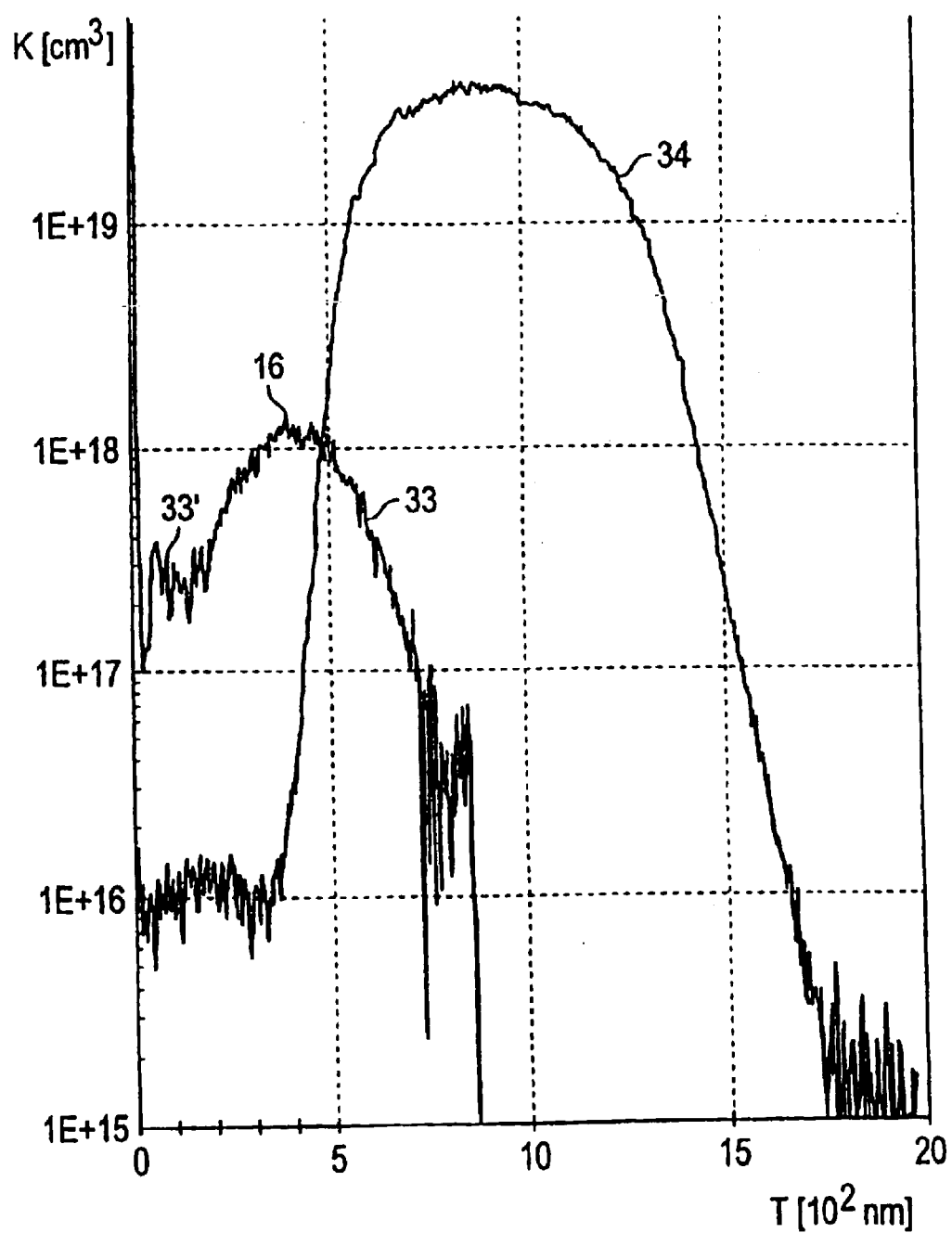
FIG. 4 shows a diagram of a measurement of the profile of the doping concentration on a transistor with properties which are optimized with regard to the radiofrequency properties.

An SIMS (Secondary Ion Mass Spectrometry) measurement of the doping concentration K in the case of an RF transistor in accordance with the Figures is represented in FIG. 4. Curve 34 represents the concentration profile of the dopants in the buried doping region. Curve 33 represents the concentration profile for the retrograde doping (corresponding to reference symbol 3' in FIG. 2) with a maximum 16 at approximately the depth T=400 nm. This curve flattens out in the direction of the substrate surface at T<=200 nm (corresponding to reference symbol 3 in FIG. 2).

I claim:
1. A method for fabricating an active transistor region in bipolar technology on a substrate, the method having the following steps:

providing a substrate with a substrate surface, producing a buried doping region in the substrate, producing an epitaxial layer, which is doped more lightly than the buried doping region, on the substrate, producing an oxide layer above the epitaxial layer, producing a doped polysilicon layer above the oxide layer, etching an opening into the polysilicon layer with the etching stopping on the oxide layer, so that the opening reaches as far as the oxide layer, producing a retrograde doping profile in the epitaxial layer by a multistage high-energy implantation of suitable dopants so that the highly doped region of the buried doping region is enlarged in the direction of the substrate surface, then fabricating a base region after the multistage high-energy implantation; and then fabricating an emitter region.

2. A method as claimed in claim 1, which includes producing an arrangement for laterally limiting the propagation of the implanted dopants before the step of high-energy implantation for producing the retrograde doping profile.

3. A method for fabricating an arrangement which is integrated on a substrate and comprises a bipolar transistor of a first type with a high breakdown voltage and a bipolar transistor of a second type with a high cut-off frequency, the two bipolar transistors having a common epitaxial layer above a buried doping region, the method having the steps of:

providing a substrate with a substrate surface, producing a buried doping region in the substrate, producing an epitaxial layer, which is doped more lightly than the buried doping region, on the substrate, before fabricating a base region, producing a retrograde doping profile in the epitaxial layer only in the region of the bipolar transistor of the second type by a multistage high-energy implantation of suitable dopants so that, in the region of the bipolar transistor of the second type, the highly doped region of the buried doping region is enlarged in the direction of the substrate surface.

4. A method as claimed in claim 3, which includes producing a planar doping profile by in-situ doping at least in the region of the transistor of the first type during the step of producing the epitaxial layer.

5. A method according to claim 3, which includes producing an oxide layer on the epitaxial layer before producing the retrograde profile so that the multistage high-energy implantation occurs through the oxide layer.

6. A method for fabricating an active transistor region in bipolar technology on a substrate, the method having the following steps:

providing a substrate with a substrate surface, producing a buried doping region in the substrate, producing an epitaxial layer, which is doped more lightly than the buried doping region, on the substrate, producing an oxide layer above the epitaxial layer, producing a doped polysilicon layer above the oxide layer, etching an opening into the polysilicon layer with the etching stopping on the oxide layer, so that the opening reaches as far as the oxide layer, before fabricating a base region, producing a retrograde doping profile in the epitaxial layer by a multistage high-energy implantation of suitable dopants so that the highly doped region of the buried doping region is enlarged in the direction of the substrate surface, then fabricating the base region after the multistage high-energy implantation; and then fabricating an emitter region so that the base region lies between the highly-doped region and the emitter region.

7. A method as claimed in claim 6, which includes producing an arrangement for laterally limiting the propagation of the implanted dopants before the step of high-energy implantation producing the retrograde doping profile.

* * * * *